(12) United States Patent
Weinraub

(10) Patent No.: US 10,996,271 B1
(45) Date of Patent: May 4, 2021

(54) FAST IJTAG

(71) Applicant: Apple Inc., Cupertino, CA (US)

(72) Inventor: Chananiel Weinraub, Ramat Hasharon (IL)

(73) Assignee: APPLE INC., Cupertino, CA (US)

(*) Notice: Subject to any disclaimer, the term of this patent is extended or adjusted under 35 U.S.C. 154(b) by 0 days.

(21) Appl. No.: 16/724,295

(22) Filed: Dec. 22, 2019

(51) Int. Cl.
*G01R 31/3177* (2006.01)
*G01R 31/3185* (2006.01)
*G01R 31/28* (2006.01)

(52) U.S. Cl.
CPC ..... *G01R 31/3177* (2013.01); *G01R 31/2851* (2013.01); *G01R 31/318533* (2013.01); *G01R 31/318547* (2013.01); *G01R 31/318588* (2013.01); *G01R 31/318597* (2013.01)

(58) Field of Classification Search
CPC ............ G01R 31/3177; G01R 31/2851; G01R 31/318547; G01R 31/318597; G01R 31/318588; G01R 31/318533
USPC ......................................... 714/726, 727, 729
See application file for complete search history.

(56) References Cited

U.S. PATENT DOCUMENTS

| | | | | |
|---|---|---|---|---|
| 7,954,022 B2* | 5/2011 | Chakraborty .. | G01R 31/318558 | |
| | | | | 714/726 |
| 9,811,690 B2* | 11/2017 | Dworak | ................... | G06F 21/80 |
| 9,818,000 B2* | 11/2017 | Dworak | ......... | G01R 31/318588 |
| 10,541,043 B1* | 1/2020 | Wisnesky, II | .... | G11C 29/12015 |
| 10,690,718 B2* | 6/2020 | Johnson | ......... | G01R 31/318588 |
| 2011/0083195 A1* | 4/2011 | Crouch | .......... | G01R 31/318588 |
| | | | | 726/27 |
| 2011/0314514 A1* | 12/2011 | Goyal | .............. | G01R 31/31719 |
| | | | | 726/2 |
| 2015/0349968 A1* | 12/2015 | Dworak | ................... | G06F 21/79 |
| | | | | 380/28 |
| 2015/0349969 A1* | 12/2015 | Dworak | ................... | G06F 21/80 |
| | | | | 380/28 |
| 2017/0131355 A1* | 5/2017 | Johnson | ........... | G01R 31/31719 |
| 2017/0205462 A1* | 7/2017 | Mukherjee | ..... | G01R 31/318555 |

(Continued)

OTHER PUBLICATIONS

ASSET, Inc., IEEE P1687 Internal JTAG (IJTAG) Tutorial, 2011, ASSET InterTech, Inc., pp. 1-9. (Year: 2011).*

(Continued)

*Primary Examiner* — John J Tabone, Jr.
(74) *Attorney, Agent, or Firm* — Kligler & Associates Patent Attorneys Ltd

(57) ABSTRACT

An IC includes testing circuitry including a Test Access Port (TAP) controller and Segment-Insertion-Bit circuits (SIBs) arranged in multiple hierarchy levels. Some of the SIBs are connected to hardware units, and some of the SIBs are root-SIBs that connect between neighbor hierarchy levels. A test bus runs in a daisy-chained loop path starting at the TAP controller, passing via at least some of the SIBs and ending at the TAP controller. Each root-SIB has an Open state and a Closed state. The TAP controller, for a selected subset of the hardware units that are to be tested, selects one or more root-SIBs that, when set to the Open state, make the selected subset of hardware units reachable by the test bus, and sends via the daisy-chained test bus a data stream comprising one or more instructions that set two or more of the selected root-SIBs to the Open state.

18 Claims, 11 Drawing Sheets

(56) References Cited

U.S. PATENT DOCUMENTS

2019/0086472 A1* 3/2019 Johnson ......... G01R 31/318588

OTHER PUBLICATIONS

Doege et al., The Advantages of Limiting P1687 to a Restricted Subset, 2008, IEEE, pp. 1-8. (Year: 2008).*

Fkih et al., 2D to 3D Test Pattern Retargeting Using IEEE P1687 Based 3D DFT Architectures, Feb. 23, 2015, HAL, pp. 1-7. (Year: 2015).*

Gupta et al., Increasing IJTAG Bandwidth and Managing Security through Parallel Locking-SIBs, 2017, IEEE, 1-10. (Year: 2017).*

Gupta, mproving System-On-Chip Test Networks For: Bandwidth, Security, and Power, May 19, 2018, Computer Science and Engineering, pp. 1-90. (Year: 2018).*

Zadegan et al., A Self-Reconfiguring IEEE 1687 Network for Fault Monitoring, 2016, IEEE, pp. 1-7. (Year: 2016).*

Zadegan et al., Access Time Analysis for IEEE P1687, 2012, IEEE, pp. 1-15. (Year: 2012).*

Zadegan et al., Design Automation for IEEE P1687, 2011, IEEE, pp. 1-6. (Year: 2011).*

IEEE Std 1500™—2005, "IEEE Standard Testability Method for Embedded Core-based Integrated Circuits", pp. 1-128, Aug. 29, 2005.

International Standard IEC 62528, "Standard Testability Method for Embedded Core-based Integrated circuits", Edition 1.0, pp. 1-130, Nov. 2007.

IEEE Std 1149.1™—2001 (R2008), "IEEE Standard Test Access Port and Boundary-Scan Architecture", pp. 1-208, Jun. 14, 2001.

IEEE Std 1687™—2014, "IEEE Standard for Access and Control of Instrumentation Embedded within a Semiconductor Device", pp. 1-283, year 2014.

* cited by examiner

FAST IJTAG

FIELD OF THE INVENTION

The present invention relates generally to JTAG systems and, more specifically, to hierarchical JTAG scan paths.

BACKGROUND OF THE INVENTION

The IEEE Joint Test Action Group (JTAG) has published various standards relating to testing of circuit boards and devices. For example, the IEEE 1149.1™-2001 standard, entitled "IEEE Standard Test Access Port and Boundary-Scan Architecture," June, 2001, which is incorporated herein by reference, defines boundary scan mechanisms for printed-circuit boards and for devices, and is used for a variety of other applications. The IEEE1500™ standard, entitled "Standard Testability Method for Embedded Core-based Integrated Circuits," Edition 1.0, November, 2007, which is incorporated herein by reference, is based on the 1149.1 standard, and targets testing of cores.

The IEEE 1687™-2014 standard, entitled "IEEE Standard for Access and Control of Instrumentation Embedded within a Semiconductor Device," 1687-2014", Nov. 3, 2014, which is incorporated herein by reference, was defined by IEEE's Internal JTAG (IJTAG) working group and further extends the IEEE 1149.1 and the IEEE 1500 standards, focusing on design for testability (DFT) features.

SUMMARY OF THE INVENTION

An embodiment of the present invention that is described herein provides an Integrated Circuit (IC) including multiple hardware units and testing circuitry. The testing circuitry includes a Test Access Port (TAP) controller coupled to a test port of the IC, multiple Segment-Insertion-Bit circuits (SIBs) arranged in two or more hierarchy levels, wherein some of the SIBs are connected to the hardware units, and some of the SIBs are root-SIBs that connect between neighbor hierarchy levels, and a test bus, which runs in a daisy-chained loop path starting at the TAP controller, passing via at least some of the SIBs and ending back at the TAP controller. Each root-SIB has an Open state in which the root-SIB routes the test bus between the neighbor hierarchy levels, and a Closed state in which the root-SIB disconnects the test bus between the neighbor hierarchy levels. The TAP controller is configured to, for a selected subset of the hardware units that are to be tested, select one or more root-SIBs that, when set to the Open state, make the selected subset of hardware units reachable by the test bus, and send via the daisy-chained test bus a data stream comprising one or more instructions that set two or more of the selected root-SIBs to the Open state.

In some embodiments, the TAP controller is configured to send in the data stream a single instruction that sets the two or more of the selected root-SIBs to the Open state. In an embodiment, each of the selected root-SIBs is configured to receive the data stream over the test bus, to transition to the Open state responsively to the one or more instructions, and to forward the data stream downstream over the test bus to a next hierarchy level. In an example embodiment, the TAP controller is configured to further send in the data stream, together with the one or more instructions that set the root-SIBs to the Open state, data values for testing one or more of the hardware units.

In some embodiments, the TAP controller is configured to send the data stream by sending at least first and second bit streams over respective first and second lines of the test bus that are clocked by respective first and second clock signals. In a disclosed embodiment, the TAP controller is configured to send an instruction to a target SIB by sending first and second bit patterns on the first and second lines, respectively, and gating one or both of the first and second clock signals responsively to the instruction and to a distance of the target SIB from the TAP controller.

In an embodiment, the TAP controller is configured to send in the data stream a compound-command that includes a concatenation of at least two instructions for execution by different SIBs. Additionally or alternatively, the TAP controller may be configured to send in the data stream an Inquire Configuration command that sets all the root-SIBs to the Open state while bypassing the hardware units and allows flow of data through all the SIB's. In some embodiments, a given hardware unit is reachable via two or more different paths of the test bus, and at least one of the SIBs is a Bridge SIB that is configured to select and enable only a single path from among the two or more different paths to the given hardware unit.

There is additionally provided, in accordance with an embodiment of the present invention, a method for testing including receiving a test request via a test port in an Integrated Circuit (IC) that includes multiple hardware units and testing circuitry. The testing circuitry includes a Test Access Port (TAP) controller, which is coupled to the test port, multiple Segment-Insertion-Bit circuits (SIBs) arranged in two or more hierarchy levels, wherein some of the SIBs are connected to the hardware units, and some of the SIBs are root-SIBs that connect between neighbor hierarchy levels, and a test bus, which runs in a daisy-chained loop path starting at the TAP controller, passing via at least some of the SIBs and ending back at the TAP controller. Each root-SIB has an Open state in which the root-SIB routes the test bus between the neighbor hierarchy levels, and a Closed state in which the root-SIB disconnects the test bus between the neighbor hierarchy levels. Responsively to the test request, for a selected subset of the hardware units that are to be tested, one or more root-SIBs are selected by the TAP controller. The selected one or more root-SIBs, when set to the Open state, make the selected subset of hardware units reachable by the test bus. A data stream, which includes one or more instructions that set two or more of the selected root-SIBs to the Open state, is sent from the TAP controller via the daisy-chained test bus.

The present invention will be more fully understood from the following detailed description of the embodiments thereof, taken together with the drawings in which:

DETAILED DESCRIPTION OF EMBODIMENTS

Overview

Figure 1:
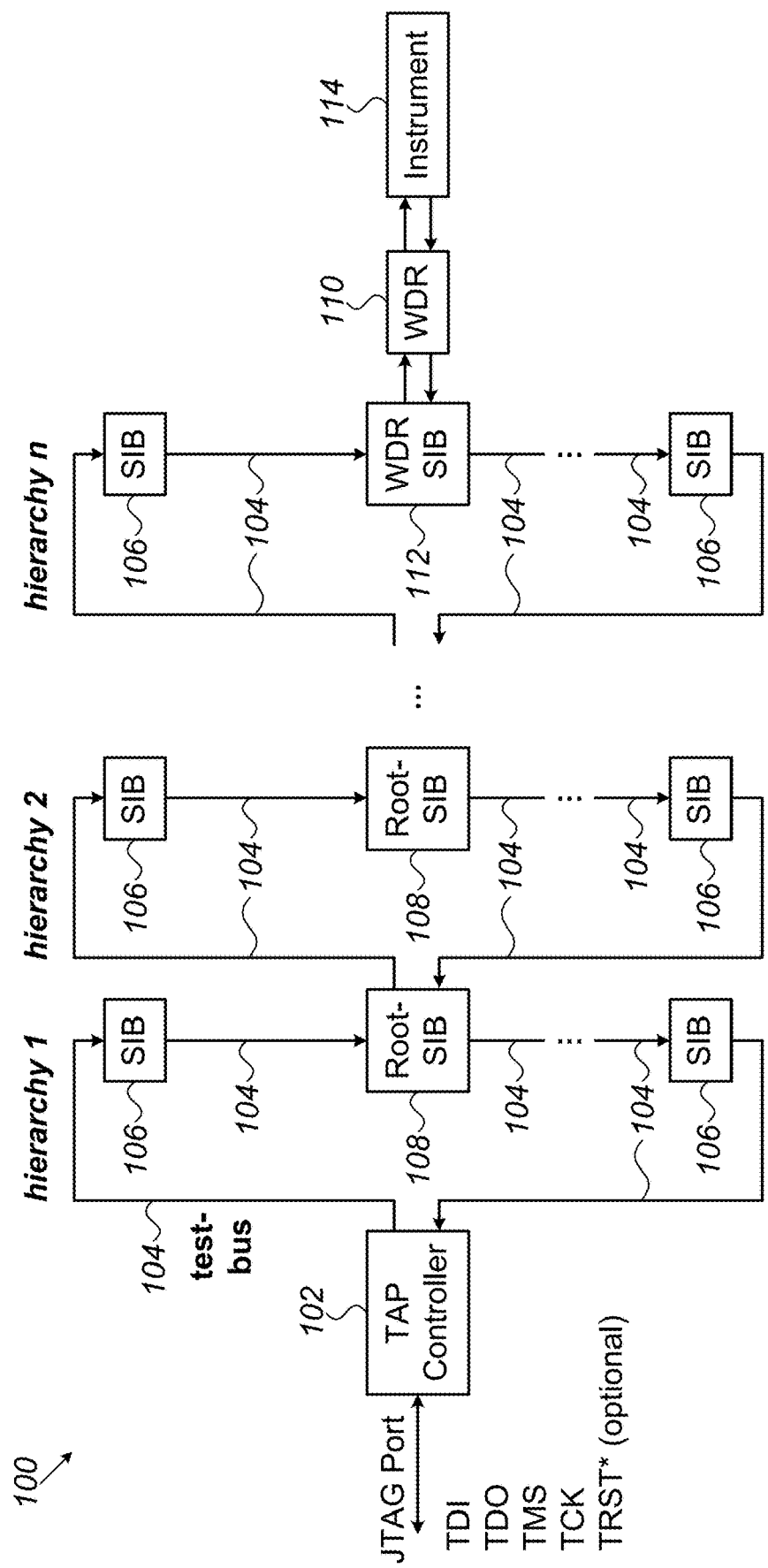
FIG. 1 is a block diagram that schematically illustrates the structure of a testing circuitry in an integrated circuit, in accordance with embodiments of the present invention.

The Institute of Electrical and Electronic Engineers (IEEE) 1687™ standard defines a mechanism, including hardware and software, for accessing "embedded instrumentation" in integrated circuits. The standard is being developed by IEEE Internal Joint Test Action Group (I-JTAG, or IJTAG). Embedded Instrumentation is a term that refers to any logic structure within a device whose purpose is Design for Test (DFT), Design-for-Debug (DFD), Design-for-Yield (DFY), etc., including Built-In-Self-Test (BIST), Calibration circuits, In-System-Emulators and others.

The IEEE 1687™-2014 standard, cited above, describes a methodology for accessing embedded instruments within a semiconductor device, without defining the instruments or their features, via the IEEE 1149.1 Test Access Port (TAP) and/or other signals, including a hardware architecture for the on-chip network connecting the instruments to the chip pins, a hardware description language to describe this network, and a software language and protocol for communicating with the instruments via the network. The IEEE 1687™-2014 standard is sometimes referred to as IJTAG; in the foregoing we will use the terms IJTAG, IEEE-1687 and, for short, 1687, interchangeably.

The basis of IJTAG hardware architecture is the instrument access network (referred to hereinbelow as "network"). The network connects instruments to the device interface. Data propagates from the JTAG test-port, through a shift register ("Data Register") that is distributed in the network, for example, in Wrapper Data Registers (WDRs), or in Segment-Insertion-Bits (SIBs), and loops back to the test-port. The network may comprise a plurality of sub-networks, including a hierarchy of networks.

Embodiments according to the present invention that are disclosed herein provide for an IEEE-1687 compliant apparatus and methods for fast and secure operation of IJTAG networks.

According to embodiments, an integrated circuit comprises testing circuitry, which comprises a TAP-Controller and a network that is coupled to a test port of the integrated circuit. A group of signals (referred to hereinbelow as Test-Bus), which comprises data signals and clock signals, propagates through the network. The data signals comprise the data-in/data-out (TDI/TDO) as defined by IJTAG and control signals that the TAP-controller generates (such as Capture, Update, Steering-Control and others); the clock signals may comprise the IJTAG TCK as well as other gated and non-gated clock signals. The daisy-chain Test-Bus propagates through SIBs, wherein in each SIB the clock signals of the Test-Bus may be buffered, and the data signals of the Test-Bus propagate through flip-flops that are clocked by one or more of the clock signals. The Data signals may be routed to/from WDRs that are coupled to the SIBs (The network may comprise other types of nodes; for simplicity we will refer hereinbelow mostly to SIBs.)

In embodiments, the structure of the Test-Bus described hereinabove allows fast operation of the IJTAG network. Each SIB sends the Test-Bus to the next SIB in a source-synchronous clocking technique; each SIB receives from a neighboring SIB clocks and data that is referenced to the clocks. Data that propagates through lower-hierarchy networks is retimed when it propagates to the higher-hierarchy network. The only global constraint is that the accumulated delay of the clocks (in the buffers of each SIB), in each sub-network and in the top-level network, should be smaller than the time period of the clock (by a margin, which is determined according to the timing requirements of the integrated circuit's process technology). Thus, according to embodiment of the present invention, high testing clock frequency may be achieved by the daisy-chaining of the Test-Bus.

In some embodiments, each sub-network is accessed by a SIB in a higher hierarchy of the network. We will refer hereinbelow to a SIB in a network that accesses a lower hierarchy network as a Root-SIB; we will further refer to SIBs that share a common Root-SIB as Peer-SIBs. Two Peer-SIBs that are coupled to each other will be referred to as Neighbor-SIBs; a SIB may have an Upstream Neighbor-SIB and/or a Downstream Neighbor SIB, wherein Upstream and Downstream refer to the direction of data propagation in the Test-Bus. We will further refer to two hierarchies that are connected by a root-SIB as neighbor hierarchies.

According to embodiments of the present invention, Root-SIBs can be programmed to be in a "closed" state or an "open" state ("Open" or "Closed"). When the Root-SIB is Closed, the Test-Bus propagates through the Root-SIB, from the Upstream Neighbor to the Downstream Neighbor. When the Root-SIB is Open, data that propagates to the Root-SIB from the Upstream Neighbor SIB propagates to a first SIB in the lower hierarchy network; and data from the last SIB of the lower hierarchy network propagates through the Root-SIB to the Downstream Neighbor SIB.

Non-Root SIBs may be coupled to Wrapped-Data-Registers (WDR). We will refer to a SIB that is coupled to a WDR as WDR-SIB. Like Root-SIBs, WDR-SIBs may be Open or Closed. When a WDR-SIB is Open, the Test-Bus will propagate through a WDR that is attached to the SIB (in some embodiments, only the TDI/TDO signal of the Test-Bus propagates through the WDR). When a WDR-SIB is Closed, the Test-Bus propagates through the SIB to the Downstream Neighbor SIB.

For shorter notation, we will hereinbelow refer to setting a SIB to the Open state or Closed state as Opening or Closing the SIB, respectively.

In an embodiment, data that propagates through the Test-Bus may comprise steering control commands, which may be decoded by the SIBs; such commands may comprise Open-SIB and Close-SIB commands. In embodiments according to the present invention, steering control commands may be concatenated in the same data stream; thus, to access an instrument in the $n^{th}$-level hierarchy, n consecutive open-SIB commands may be concatenated in the same stream. When the highest-level open-SIB command is received by the highest-level Root-SIB, the Root-SIB will allow further data of the same stream to propagate to the next hierarchy level, and so on, until the WDR-SIB that is coupled to the destination instrument is opened and the instrument may be accessed. Thus, in embodiments, the number of clock cycles that is needed to access an instrument down in the hierarchy chain is low.

In some embodiments according to the present invention, the Test-Bus comprises signals for the propagation of at least two keys. Each key may have a data signal and a clock signal (which may be gated), except for one key which may use the IJTAG data-in/data-out signal for data, and one key (the same or different) which may use the IJTAG TCK for clock, and except that some keys may share the same clock signal. The TAP Controller may change the alignment of keys relative to each other, for example, by gating the clock of some of the keys responsive to the state of the TAP-Controller FSM, and the SIBs may decode various commands according to the combinations of the keys.

In an example embodiment, two keys are used—a first key which is binary 001 and a second key which is binary 110. The TAP Controller sends the two keys over the Test-Bus, followed by a sequence of n zeroes, wherein n is the distance of the target SIB from the TAP-Controller, in clock cycles. In some embodiments, n=(number of SIBs*2)−1, since every SIB includes an input Pipe and a SIB Shift bit, and since zeroes should be shifted-in until KEYs[0] is placed in the target SIB PIPE_IN. For example, to access the $5^{th}$ SIB which is separated from the TAP-Controller by four SIBs, the TAP Controller will send over the signal that carries the first key a series of (from left to right), 100000000, and a series of 110000000 on the signal that carries the second key (5*2−1 cycles including the KEY). When the "1" of the first key reaches the target SIB, the gated clock of the first key will stop for one or two clocks, whereas the clock of the second key will continue, while the TAP's FSM is in "Pause-DR" state.

We will refer hereinbelow to the pipe delay from the TAP controller to a SIB, in clock cycles, as the "distance" of the SIB. For example, if it takes 12 clock cycles for a bus data signal, starting from the TAP-controller, to reach a given SIB through the network (including non-root-SIBs and open root-SIBs), then the distance of the SIB is 12.

All the SIBs which are upstream to the target SIB will observe a "0" in the second key (in the input PIPE) when receiving a "1" in the first key. The target SIB, however, will observe a "01" or a "011" in the second key when receiving "1" in the first key. In this example embodiment, SIBS are configured—

A—to Open (i.e., assume the Open state) if, when receiving a "1" in the first key, will receive a "0" followed by a single "1" in the second key;

B—to Close if, when receiving a "1" in the first key, will receive a "0" followed by two consecutive "1"s in the second key; and C—to do nothing if, when receiving a "1" in the first key, will receive a "0" in the second key.

To avoid opening further SIBs that are downstream from the target SIB, the TAP-Controller will realign the keys after the target key is Open, by gating-off the second key for one or more clock periods, while the first key continues, in order to simplify the SIB's Realignment logic.

In some embodiments of the present invention, more than two keys may be used, and at least some of the keys may comprise more than 3 bits. In an embodiment, a counter in the SIB may count Pause-DR states, until the required command is reached. Thus, the list of commands that can be sent to the SIBs over the Test-Bus using keys may be much larger. For example, key combinations may be used to trigger a BIST, to start a calibration process, etc. In some embodiments, key combinations may be used for compound instructions; e.g., Open a WDR-SIB AND start calibration.

Some of the IP cores that are embedded in the integrated circuit may be confidential, and access to those IP cores must be restricted. In particular, potential hackers should be prevented from opening the IP through the network. To answer this requirement, in some embodiments according to the present invention, the key combination that opens the SIB may comprise a plurality of bits and kept confidential.

Thus, IJTAG-compatible apparatuses and methods according to embodiments of the present invention, allow secure and fast testing of semiconductor devices. The testing is secure in the sense that the accessing keys are not trivial and can be kept confidential. The testing is fast in terms of low number of clock cycles, high testing frequency and addition of compound instructions that can access a SIB and start an operation. Faster testing translates to lower integrated circuit test time, and, hence, lower integrated circuit, PCB boards and systems manufacturing costs.

System Description

FIG. 1 is a block diagram that schematically illustrates the structure of a testing circuitry 100 in an integrated circuit, in accordance with embodiments of the present invention. The testing circuitry comprises a Test-Access-Port (TAP) Controller 102, which communicates with an Automatic Test Equipment (not shown) through a JTAG test-port; a Test-Bus 104; and, a plurality of Segment-Insertion-Bit units (SIBs) 106 and Root-SIBs 108, arranged in n hierarchy levels. The Root-SIBs serve as gateways to lower hierarchy levels (in the description hereinbelow we will sometimes use the term SIB to refer to any type of SIB, including Root-SIB, non-Root-SIB, WDR-SIB and non-WDR-SIBs).

The JTAG port comprises the following signals (defined by the IEEE 1687): a Test-Data-In (TDI) input, which is used to shift data into the integrated circuit; a Test-Data-Out (TDO) output, which is used to shift data out of the integrated circuit; a Test Mode Select (TMS) input, which is used to control the Finite-State-Machine (FSM) of the Tap Controller; a Test-Clock (TCK) input, which is the reference clock for TDI, TDO and TMS; and an optional TRST* input (the * indicates active-low operation), which may be used to set the testing circuitry in a known initial state.

TAP Controller 102 comprises an instruction register and an FSM (not shown), according to the definition of IEEE 1687.

TAP Controller 102 is further configured to drive a Test-Bus 104. The Test-Bus comprises, in addition to a TDI/TDO Signal, (which is used for TDI-TDO daisy-chaining) other control signals such as Capture, Shift, Update and clock signals (the full list of Test-Bus signals will be described further below).

The Test-Bus is daisy chained between the SIBs of the testing circuitry. In each SIB of the network, the Data and Control signals of the Test-Bus are routed through flip-flops, whereas the clock signals are routed through buffers. Timing discipline in the Test-Bus is source-synchronous, and each SIB samples the data/control signals with the clocks, that are input from the upstream neighbor SIB.

The clock signals of the Test-Bus comprise a TCK clock and a steering control clock; each clock is typically a gated version of the JTAG port TCK input.

A Root-SIB 108 may be Open or Closed. When the Root-SIB is Closed, it functions as a one-clock pipe, propagating the Test-Bus to the downstream neighbor. However, when the Root-SIB is Open, the Root-SIB forwards the Test-Bus to a first SIB in a lower hierarchy level and transfers the Test-Bus from the last SIB of the lower hierarchy level to the Downstream Neighbor.

FIG. 1 further illustrates a WDR 110, which is coupled to a WDR-SIB 112 (WDR-SIBs, which will be described hereinbelow, can be Opened and Closed, and can communicate with a WDR) in hierarchy level 6, and to an instrument 114. (It should be noted that instruments are not necessarily coupled to the lowest hierarchy level; instruments may be coupled to SIBs in all levels.) When WDR-SIB 112 is Open, the TDI signal of the Test-Bus propagates from the upstream SIB 106, through WDR 110, to the downstream SIB 106. When WDR-SIB 112 is closed, data propagates through WDR-SIB 112, from the upstream neighbor SIB to the downstream neighbor SIB.

The Test-Bus comprises at least two keys, that propagate in the Test-Bus and can reach any SIB for which all the Root-SIBs at higher hierarchies are Open. The combination of the values of the keys that a SIB receives through the Test-Bus defines an instruction that the SIB executes. The instructions comprise instructions that Open and instructions that Close Root-SIBs and WDR-SIBs. The Root-SIBs are configured to route the Test-Bus to the lower hierarchy SIBs when detecting the Open-SIB instruction "on the fly", so that the keys will propagate to lower hierarchies and open further Root-SIBs, until the WDR that is coupled to the target instrument is reached (as will be described below, the WDR shift may be delayed, typically by 3 clock cycles (KEY width), in each WDR-SIB that receives an Open-SIB instruction). The configuration of the Root-SIB described hereinabove, and, in particular, the "on-the-fly" forwarding of the keys by a SIB that is opened by the same keys, significantly reduces the test time, as the same pattern can open SIBs and propagate all the way to the target instrument, rather than having a separate pattern after each new hierarchy level is opened.

Thus, according to the example embodiment illustrated in FIG. 1, tests that the ATE performs on an integrated circuit are fast (and, hence, inexpensive), due to the source-synchronous configuration of the busses, and due to the on-the-fly bus routing through the Root-SIBs.

As would be appreciated, testing circuitry 100 illustrated in FIG. 1 and described hereinabove is cited by way of example. In alternative embodiments various suitable structures may be used. For example, other network elements (some of which are described in the IEEE 1687) may be added, such as multiplexors. In an embodiment, two or more separate Test-Busses may be used, operated concurrently by a single or by a plurality of TAP controllers.

Figure 2:
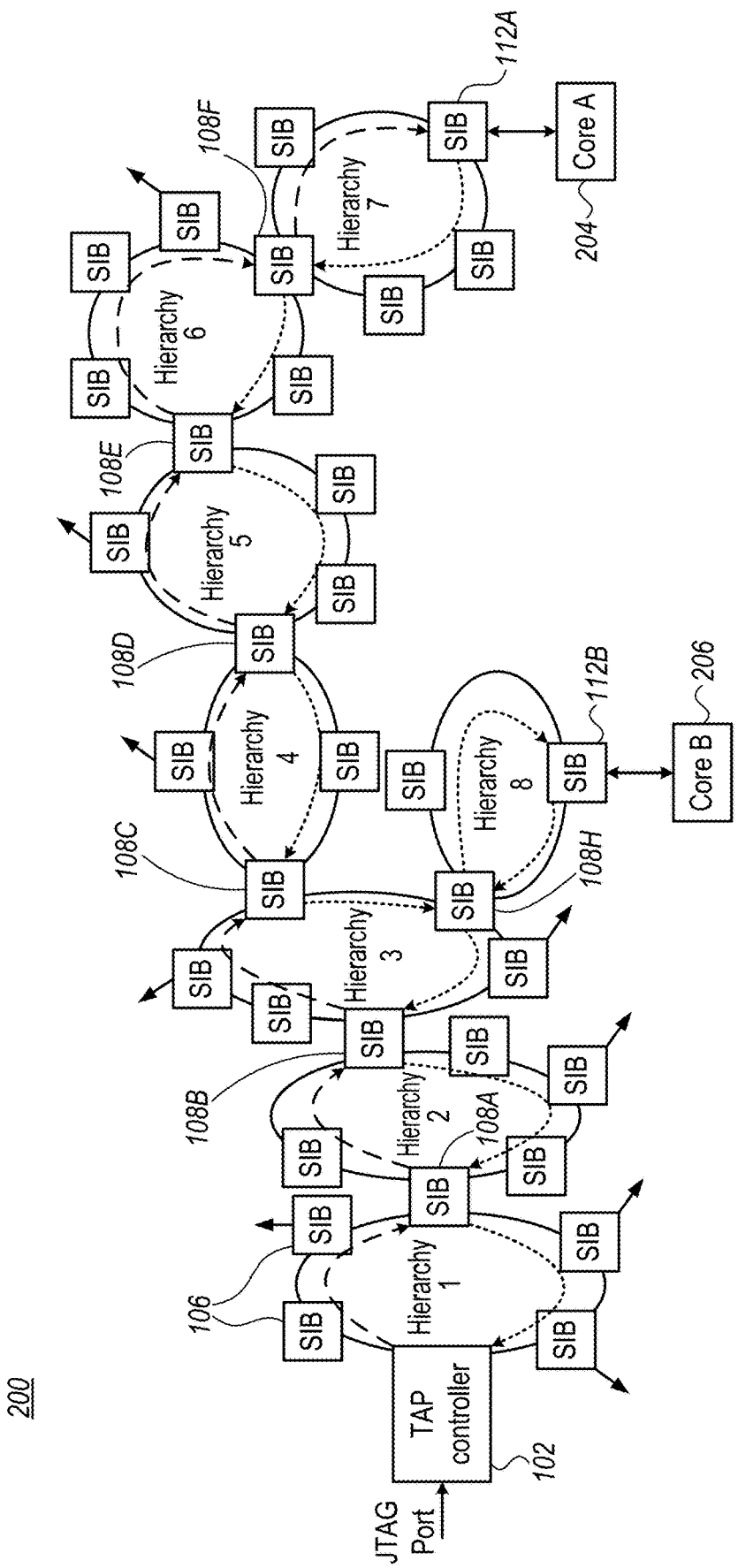
FIG. 2 is a block diagram that schematically illustrates network hierarchies in an example testing circuitry, in accordance with embodiments of the present invention.

FIG. 2 is a block diagram that schematically illustrates network hierarchies 200 in an example testing circuitry, in accordance with embodiments of the present invention. TAP Controller 102 drives a Test-Bus, which connects all SIBS in the highest hierarchy level (Hierarchy 1). The network further comprises Root-SIBs 108A through 108H and WDR-SIBs 112A, 112B.

The keys that Tap Controller 102 sends arrive at Root-SIB 108A, which Opens and forwards the keys to Hierarchy 2. When the keys arrive at Root-SIB 108B, the Root-SIB Opens, and forwards the keys to hierarchy 3.

The process described hereinabove continues, through Root-SIBs 108C, 108D, 108E and 108F, until hierarchy 7 is reached. Thereafter, the Test-Bus propagates through SIBs 106 of hierarchy 7, and then reaches and Opens WDR-SIB 112A, at which time communication with Core A 204 (through a WDR, not shown) will be established, using testing data values which that follow the keys.

The keys will continue to propagate through peer-SIBs 106 of hierarchy 7, reach Root-SIB 108F, (which is now Open); continue through SIBs 106 of hierarchy 6 to Root-SIB 108E, and so on until the keys reach hierarchy 3 through Root-SIB 108C. In hierarchy 3, the keys will propagate through SIBs 106, until the keys reach Root-SIB 108H, which will open, and forward the keys to SIBs 106 of hierarchy 8. When the keys will reach SIB 112B, SIB 112B will open, and thence communicate (through a WDR) with Core B 206.

Thus, in a single stream that TAP controller 102 sends, the path to both core A 204 and core B 206 will be opened; write-data from the JTAG port will arrive at the cores and read-data will arrive at the JTAG port (through the Data signal of the Test-Bus).

As would be appreciated, the network hierarchies illustrated in FIG. 2 and described hereinabove are cited by way of example. In alternative embodiments various suitable networks may be used, which may include, in addition to SIBs 106 other elements such as registers, multiplexers and the like.

Figure 3:
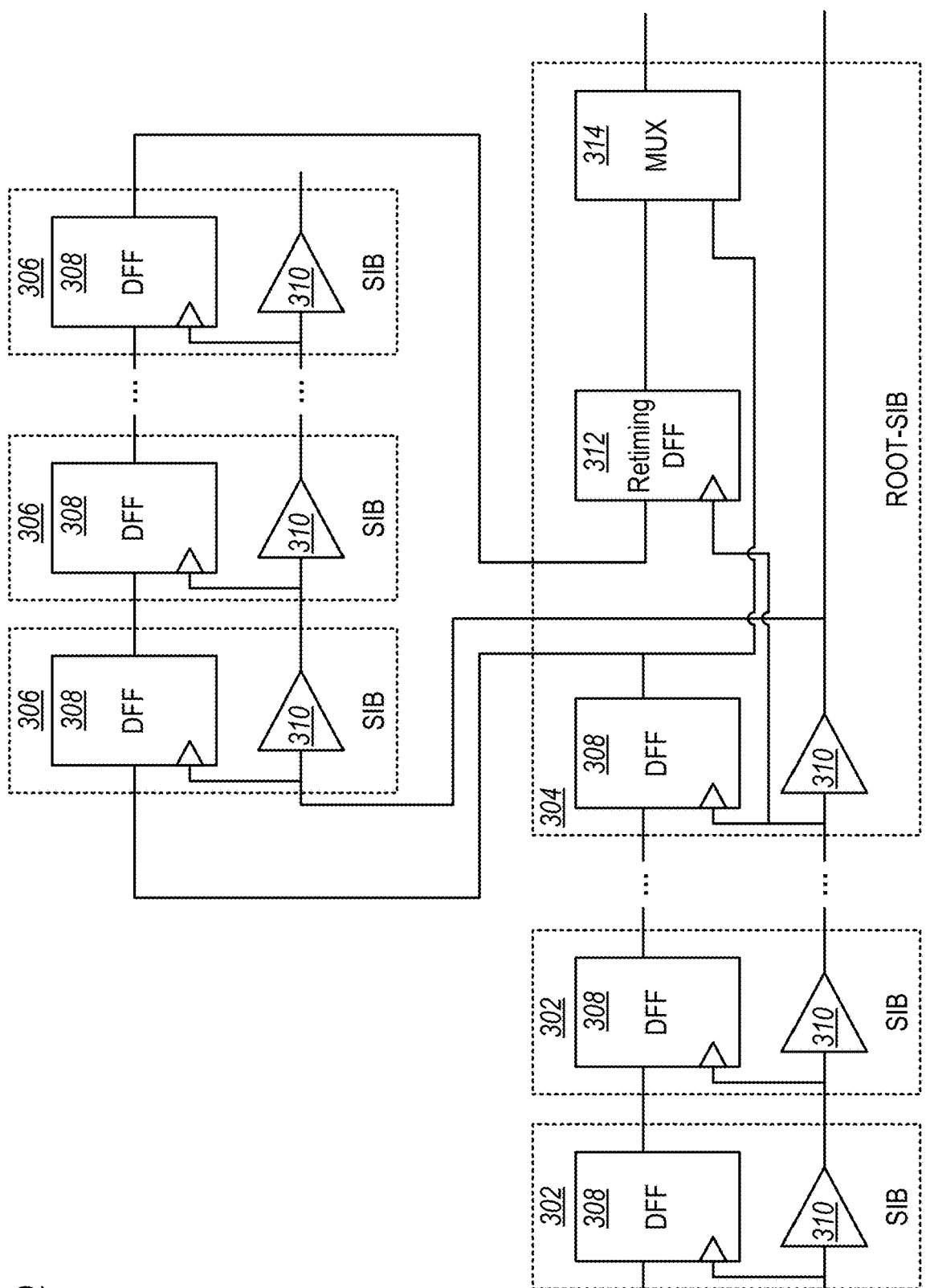
FIG. 3 is a circuit diagram that schematically illustrates retiming of Test-Bus signals, in accordance with embodiments of the present invention.

FIG. 3 is a circuit diagram 300 that schematically illustrates retiming of Test-Bus signals, in accordance with embodiments of the present invention. Some elements of the SIB and the Root-SIB are omitted from FIG. 3, for clarity.

A series of peer SIBs 302 and a Root-SIB 304 are daisy chained in a first hierarchy level; and a series of peer SIBs 306 are daisy-chained in a second hierarchy level that is lower than the first hierarchy level. When Root-SIB 304 is Open, signals of the Test-Bus propagate from the Root-SIB to SIBs 306 of the second hierarchy, return to the first hierarchy through the Root-SIB and then continue to propagate in the first hierarchy (as would be appreciated, FIG. 3 shows only a segment of the Test-Bus, which may comprise more levels of hierarchy, below and above the illustrated levels).

In each SIB, the data signals of the Test-Bus propagate through single-clock delay element 308 (e.g., a D-type flip-flop (DFF)) in addition to the 1687 Shift bit, which is clocked by a Test-Bus clock signal, whereas the clock signals are buffered by a buffer 310. This configuration is referred to as source-synchronous clocking and allows easy timing design of the Test-Bus within the same hierarchy.

When the Test-Bus propagates to a lower hierarchy through Root-SIB 304, the source-synchronous configuration continues until the data signals return to the Root-SIB. Thereafter, the data signals have accumulated the delay of the lower hierarchy, and need to be retimed to the clock of the Root-SIB. This is done by sampling the returned data in a retiming DFF 312, with the input clock of Root-SIB 304. If the accumulated delay of the Test-Bus in the lower hierarchy SIBs is lower than the clock period (by a margin which is needed for race-free sampling; e.g., 33%), the returning data signals of the Test-Bus will continue to propagate, with a single clock delay (for the highest hierarchy level, retiming DFF 312 is typically implemented in every SIB and optionally next to the TAP Controller).

A multiplexor 314 forwards the output of either DFF 312 (if the Root-SIB is Open) or DFF 308 (if the Root-SIB is Closed) to the downstream neighbor SIB.

Thus, according to the example embodiment illustrated in FIG. 3, the timing of a Test-Bus can be easily designed, irrespective of the size of the integrated circuit (and the size of the test network). The only timing constraint to be met is that in each hierarchy, the accumulated delay from the Root-SIB output to the Root-SIB input will be smaller than the clock period by a predefined margin.

The same (or similar) retiming may be used when data from a WDR returns to a coupled SIB.

As would be appreciated, circuit diagram 300 illustrated in FIG. 3 and described hereinabove is cited by way of example. In alternative embodiments various suitable circuits may be used. In some embodiments, for example, multiplexor 314 selects either the input from DFF 308 or the input from the lower-hierarchy SIB, and forwards the selected input to Retiming DFF 312 (in this embodiment the Test-Bus output of Root-SIB 304 is from Retiming DFF 312 that will add a pipe delay when the SIB is closed).

Figure 4:
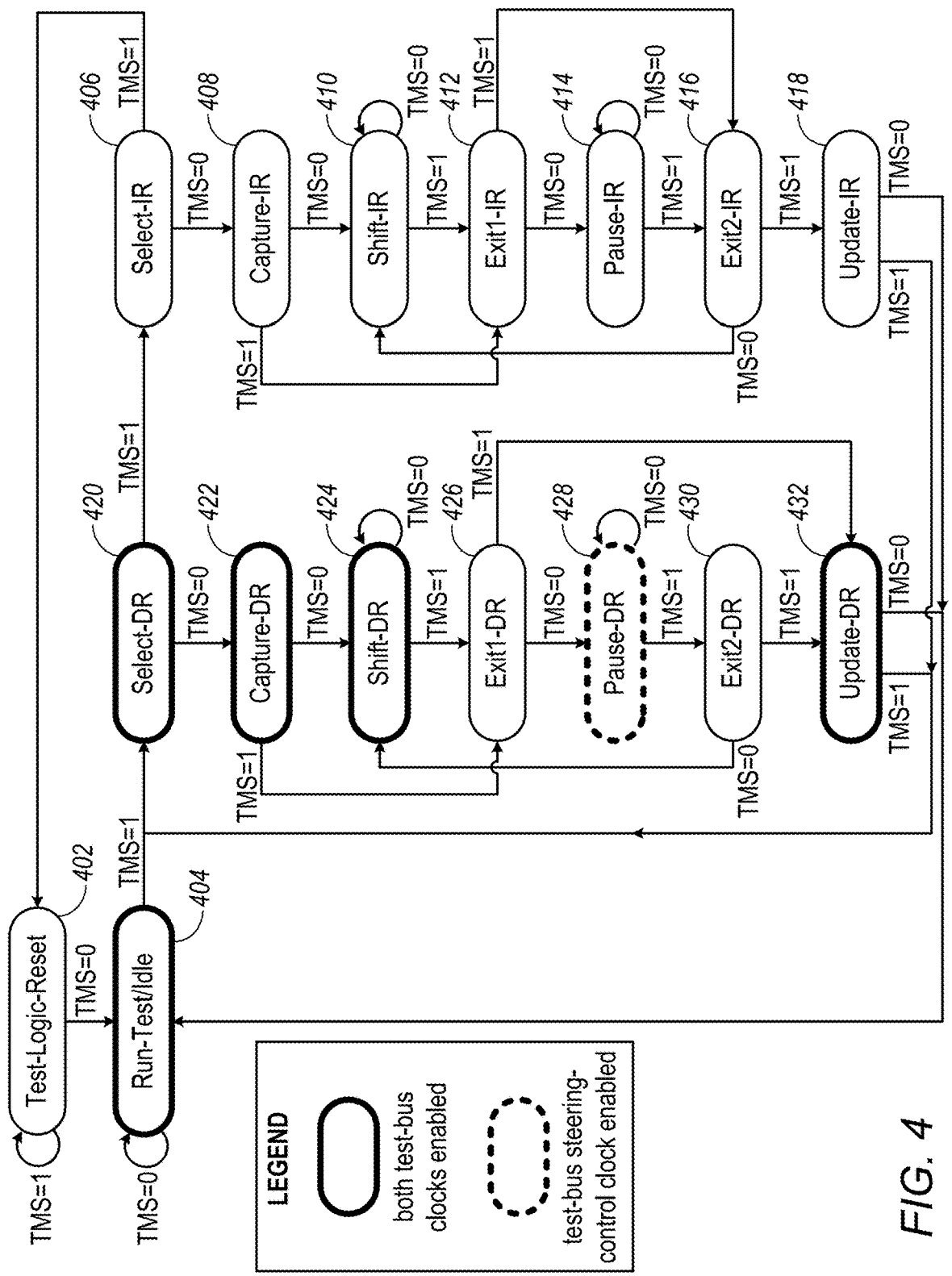
FIG. 4 is a state-diagram that schematically illustrates clock gating responsive to the states of a Test Access Port (TAP) Controller, in accordance with embodiments of the present invention.

FIG. 4 is a state-diagram that schematically illustrates clock gating responsive to the states of the TAP Controller, in accordance with embodiments of the present invention.

The states of the TAP Controller are defined in the Finite-State-Machine (FSM) illustrated in FIG. 4, and comprise the following states: a Test-Logic-Reset (TLR) state 402; a Run-Test/Idle (RTI) state 404; a Select-IR state 406; a Capture-IR state 408; a Shift-IR state 410; an Exit1-IR state 412; a Pause-IR state 414; an Exit2-IR state 416; an Update-IR state 418; a Select-DR state 420; a Capture-DR state 422; a Shift-DR state 424; an Exit1-DR state 426; a Pause-DR state 428; an Exit2-DR state 430; and an Update-DR state 432. The states and the transitions between the states are described in IEEE 1687, section 4.2.2.

According to the example embodiment illustrated in FIG. 4, when the FSM is in one of RTI state 404, Select-DR state 420, Capture-DR state 422, Shift-DR state 424 or Update-DR state 432, the TAP Controller will enable the clock signals (TCK and steering-control clock) of the Test-Bus (in alternative embodiments, the TAP Controller may enable the clock signals also in Test-Logic-Reset state 402); when the FSM is in Pause-DR state 428, the TAP controller will enable only the steering-control clock of the Test-Bus; and, in all other states, the TAP Controller will not send any clocks over the Test-Bus.

Thus, by stepping through the Pause state, the TAP controller may shift a key that is clocked by the TCK relative to a key that is clocked by the steering control clock. According to some embodiments, the relative shift of the two keys from each other may be used to define instructions to Open and Close SIBs, as well as other instructions.

Figure 5:
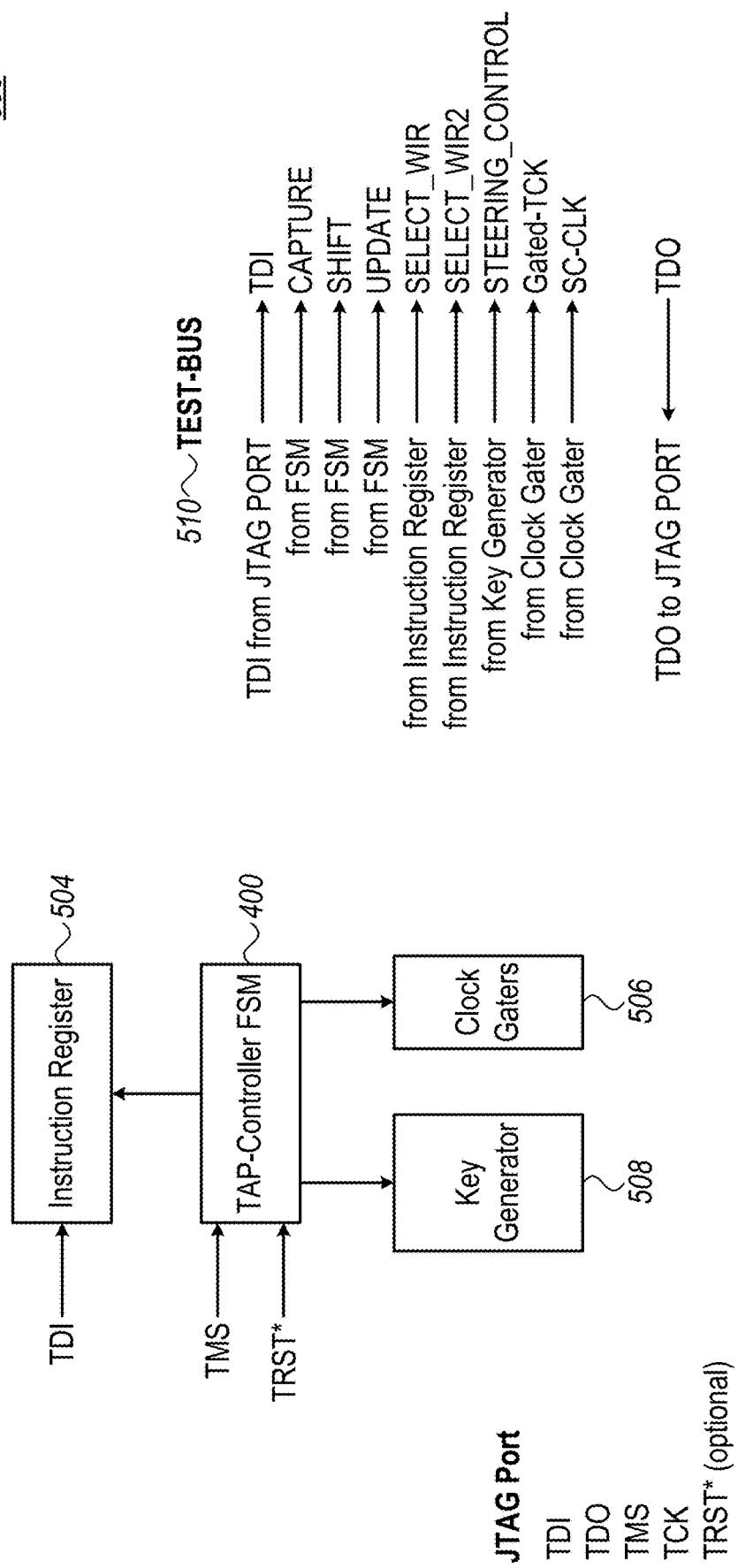
FIG. 5 is a conceptual block diagram that schematically describes the main units of a TAP Controller, in accordance with embodiments of the present invention.

FIG. 5 is a conceptual block diagram 500 that schematically describes the main units of a TAP Controller, in accordance with embodiments of the present invention. The TAP Controller (designated 102 in FIG. 1) comprises a TAP-Controller FSM 400 (FIG. 4), an Instruction Register 504, Clock-Gaters 506 and a Key-Generator 508 (comprising generators for at least one key). The Tap Controller is coupled to the JTAG port of the integrated circuit, and drives a Test-Bus 510, which propagates through the SIBs of the network.

FSM 400 receives the TCK, TMS and (optionally) the TRST* from the JTAG port, and follows the states as illustrated in FIG. 4. Instruction Register 504 typically comprises a master shift register, which shifts TDI bits in when FSM 400 is in Shift-IR state 410, and a slave register, which loads the contents of the master shift register when the FSM 400 is in Update-IR state 418 (see FIG. 4 for the states mentioned above).

Test-Bus 510 comprises the following signals: TDI, which may be a replica (possibly delayed) of the JTAG port TDI input; Capture, Shift and Update, which are the decoding (possibly delayed) of FSM 400 states Capture-DR 422, Shift-DR 424 and Update-DR 432, respectively; Select-WIR and Select-WIR2, which represent the decoding of instructions that are stored in Instruction Register 504; Steering Control, which is a bit pattern that is generated by Key-Generator 508; and the pair of gated clocks Gated-TCK/Steering-Control-CLK ("SC-CLK"), which are gated versions of the JTAG port's TCK (SC-TCK is enabled when FSM 400 is in Pause-DR state 428; both clocks are enabled when FSM 400 is in one of states 404, 420, 422, 424 or 432; see FIG. 4). For shorter notation, the contents of the data part of the Test-Bus will be referred to hereinbelow as dcsuw2t [6:0], where in:

dcsuw2t[6] is Data (Test-Data-In);
dcsuw2t[5] is Capture;
dcsuw2t[4] is Shift;
dcsuw2t[3] is Update;
dcsuw2t[2] is Select-WIR;
dcsuw2t[1] is Select-WIR2; and
dcsuw2t[0] is Steering-Control.

The Test-Bus propagates through SIBs of the network and returns to the TAP Controller. The returned Data signal is retimed to Gated-TCK (the retiming is not shown) and forwarded to the JTAG Port, pad TDO.

Keys Generation and Usage

According to some embodiments of the present invention, keys generation and usage follows the following rules:

1. The KEYs are always sent first during Shift-DR state; The SIBs are configured so that the keys will bypass all WDRs.
2. The LSB of the first key is logic-1; which is interpreted as Enable, and the following bits are logic-0, and interpreted as Disable. In an embodiment, TDI may be used for the first key, and, for an Open-SIB instruction, starts with a sequence of TDI[2:0]=3'b001.
3. The TAP Controller generates the Clocks of the keys, using TCK Clock Gaters.
4. The TAP Controller sets the initial value of the keys during the Run-Test-Idle, Select-DR and Capture-DR FSM States, using DFFs with asynchronous Set or Reset.
5. The SIB is configured to regenerate the first Capture that initiates the Open command and send it to the lower hierarchy (as the SIB is closed, the first Capture would be lost otherwise). In an embodiment, the second key is set to a sequence 3'b110.
6. Non-Root SIBs that drive WDRs are configured to send the key bits downstream, bypassing the WDR before shifting the WDR's captured data.
7. If the SIB is Closed, the Capture signal do not pass; hence, an Open instruction generates a Capture signal prior to the shift
7. After Pause-DR, the first Shift-DR cycle will sample the required state into the SIB's Shift and Update signals, using TCK, and, at the same time, disable SC-CLK, in order to simplify KEYs Re-Alignment logic.

Figure 6:
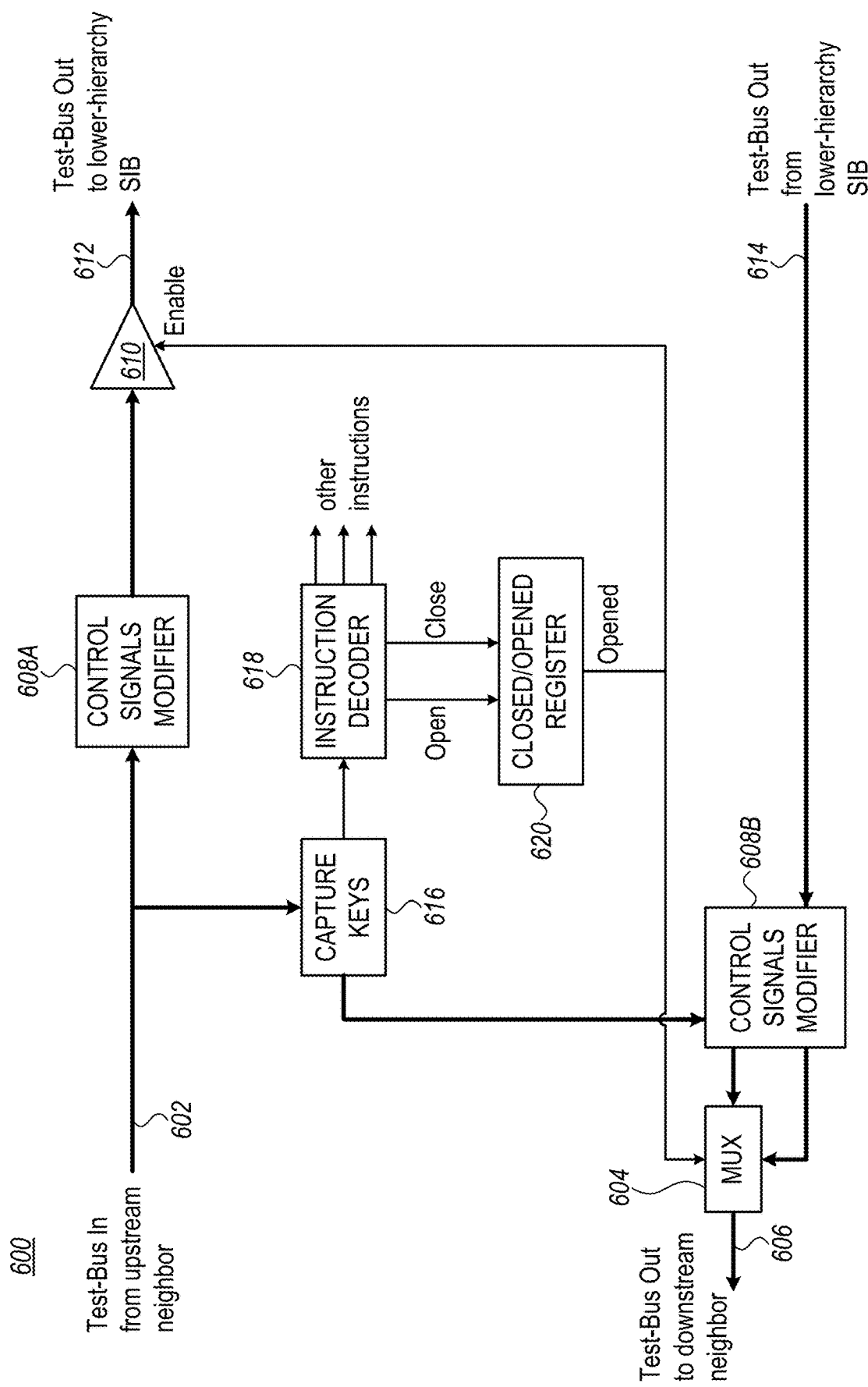
FIG. 6 is a conceptual routing diagram that schematically describes Test-Bus routing by a Root-SIB, in accordance with embodiments of the present invention.

FIG. 6 is a conceptual routing diagram 600 that schematically describes Test-Bus routing by a Root-SIB, in accordance with embodiments of the present invention. As would be appreciated, routing diagram 600 does not show timing elements, flip-flops and other circuits, and illustrates the routing paths and associated conceptual units only.

A Test-Bus-In 602 is input to the Root-SIB from an upstream neighbor SIB. If the Root-SIB is Closed, the Test-Bus-In will be routed, through a Multiplexor 604, to a Test-Bus-Out 606 that is coupled to the downstream SIB (as noted above, this is a conceptual routing example, which ignores, for example, any pipe stages that may be inserted in the path from Test-Bus-In 602 to Test-Bus-Out 606).

If the Root-SIB is Open, Test-Bus-In 602 will be routed, through a Control-Signal-Modifier 608 and a Gater 610, to a Test-Bus-Out 612, which is coupled to SIBs in a lower hierarchy. In addition, when the Root-SIB is Open, a Test-Bus-In 614, which is driven by the last SIB of the lower hierarchy, is routed by Multiplexor 604 to Test-Out-Bus 606.

A Capture-Keys unit 616 samples the TDI and the Steering-Control signals of Test-Bus-In 602, using Gated-TCK and SC-CLK, respectively. An Instruction-Decoder 618 interprets the sampled data from Capture-Keys unit 616 as keys and decodes from the keys instructions that the SIB should execute, including an Open-SIB instruction and a Close-SIB instruction, and, possibly, other instructions.

If the Instruction Decoder decodes an Open-SIB or a Close-SIB instruction, the Instruction Decoder will set the value of a Closed-Open Register 620, which indicates if the SIB is Closed or Open, accordingly.

As describes hereinabove some of the control signals are modified by the SIB. This is done by Control Signals Modifier 608.

Closing Options

When receiving a Close instruction, SIBs in accordance with embodiments of the present invention may be configured to:

1. Close the SIB and keep lower Hierarchies reset inactive; thus, the lower SIBs state will not change, and instruments will continue to operate;
2. Close the SIB, keep lower Hierarchies reset inactive, reset all lower Hierarchies SIB's Shift and Update flip-flops so that all lower Hierarchies will be closed, enabling instruments to continue operation
3. Close the SIB and reset all lower Hierarchies including all SIBs and Instruments.

The selected configuration may be hard wired or selected, for example, by the IR.

Figure 7:
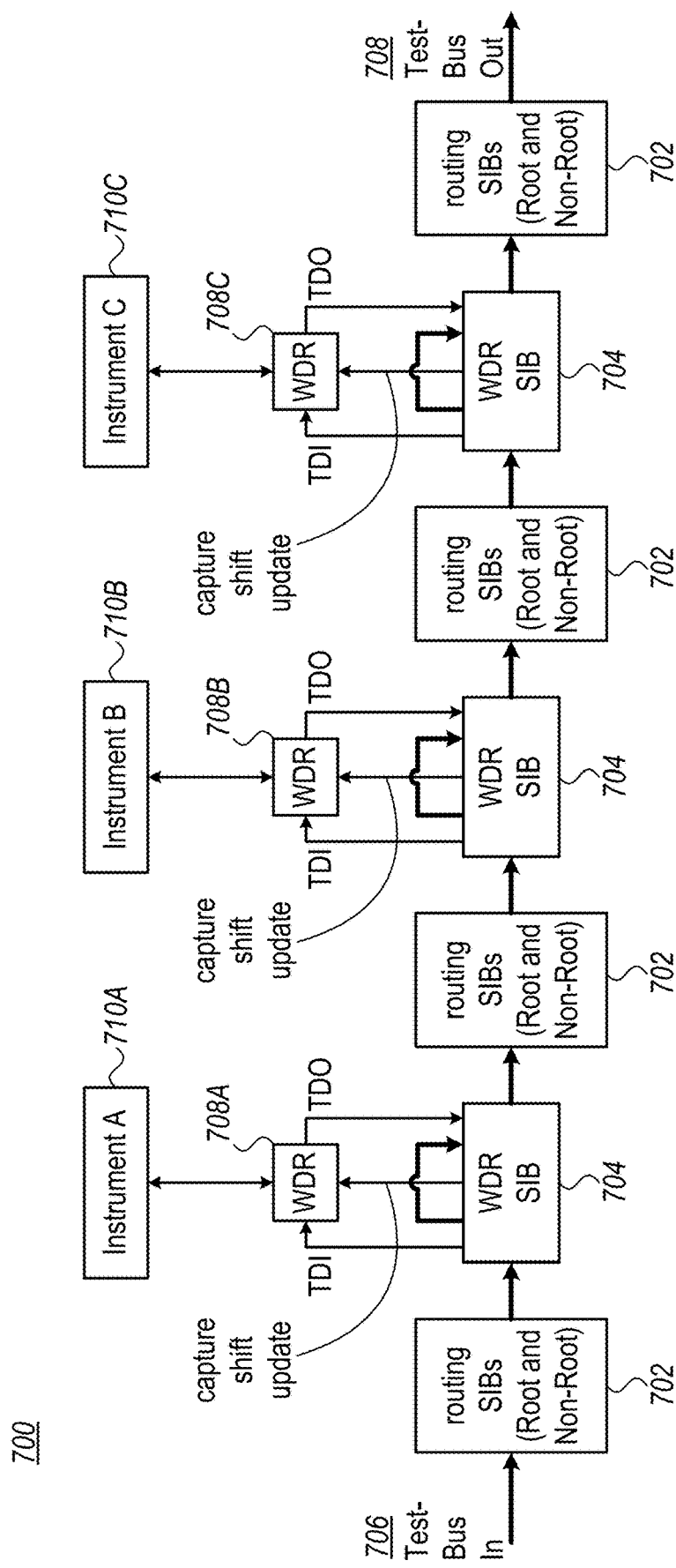
FIG. 7 is a block diagram that schematically describes an example configuration of the testing network with three instruments, in accordance with embodiments of the present example.

FIG. 7 is a block diagram 700 that schematically describes an example configuration of a testing network with three instruments, in accordance with embodiments of the present invention.

The network comprises routing SIBs 702, including both Root-SIBs and non-ROOT-SIBs; and WDR SIBs 704, which are coupled to WDRs. The network receives from the TAP Controller a Test-Bus-In 706, which propagates through the network; and outputs a Test-Bus-Out 708 to the TAP Controller.

A first WDR-SIB 704 is coupled to a WDR 708A; a second WDR SIB is coupled to a WDR 708B; and a third WDR SIB is coupled to a WDR 708C. The WDRs are coupled to an Instrument A 710A, an Instrument B 710B and an Instrument C 710C.

In the description hereinbelow, we assume that the three WDR-SIBs are Open, and the network is communicating with the three instruments. The Test-Bus propagates through the routing SIBs. In the WDR-SIBs, the TDI-TDO signal of the Test-Bus propagates through the WDR; the other Test-Bus signals propagate through the WDR-SIB. The WDR-SIBs also control the Shift, Capture and Update inputs of the WDR.

When Accessing multiple Cores, TDI data payload for writing to the WDRs comprises the WDRs and the SIBs Shift bits between the WDRs, followed by the number of pipes+(number of SIBs to be opened)*3, and ending with the keys which are the LSBs.

As would be appreciated, block diagram 700 illustrated in FIG. 7 and described hereinabove is cited by way of example. In alternative embodiments various suitable structures may be used, including multiplexors, Root-SIBs that are also WDR-SIBs, networks comprising multiple Test-Busses, and others.

Figure 8A:
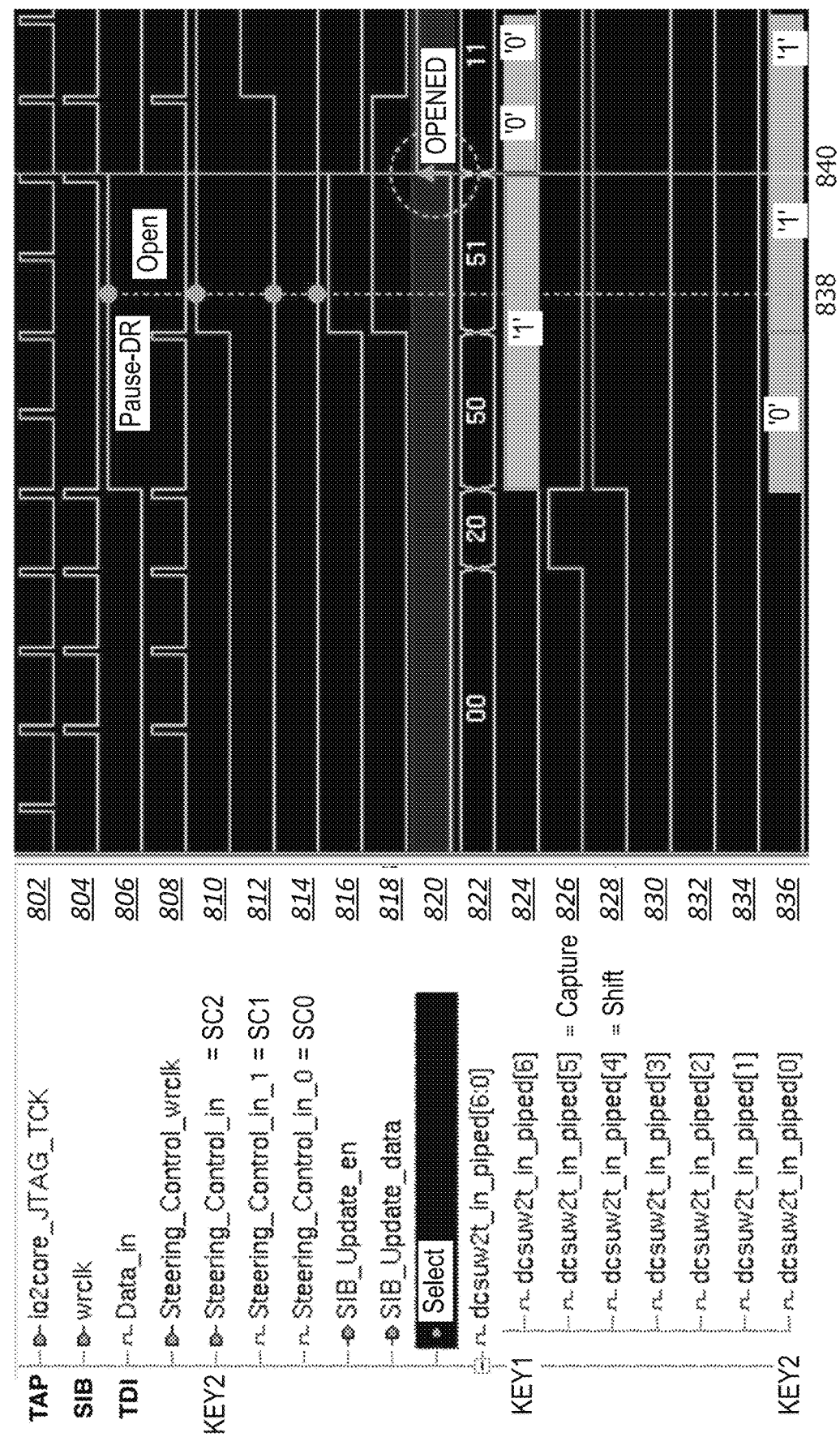
FIG. 8A is a timing diagram that schematically describes the timing waveform of the key signals, in an Open-SIB command, in accordance with embodiments of the present invention.

FIG. 8A is a timing diagram that schematically describes the timing waveform of the key signals, in an Open-SIB command, in accordance with embodiments of the present invention.

The Waveform illustrated in FIG. 8A is a capture of the logic simulation of an example embodiment; the signal names fit the simulation names and may vary from the names in the descriptions herein.

The waveform comprises:
A TCK signal 802—the TCK clock at the JTAG input ("io2core_JTAG_TCK" in the figure);
A Gated-TCK 804 signal ("wrclk"; part of Test-Bus 510);
TDI signal 806 ("Data in"; part of Test-Bus 510);
An SC-CLK signal 808 ("Steering Control wrclk"; part of Test-Bus 510);
An SC2 signal 810 ("Steering_Control_In");
An SC1 signal 812 ("Steering_Control_in_1");
An SC0 signal 814 ("Steering_Control_in_0");
An Update Enable signal 816 ("SIB Update Enable");
An Update Data signal 818 ("SIB Update Data" part of Test-Bus 510);
A Select signal 820, which is highlighted;
A 7-bit Piped-Test-Bus 822, which comprises the latched data lines of the Test-Bus ("dcsuw2t in piped[6:0]");
The seven bits of Piped-Test-Bus 822—Piped-Test-Bus [6] 824, Piped-Test-Bus[5] 826, Piped-Test-Bus[4] 828, Piped-Test-Bus[3] 830, Piped-Test-Bus[2] 832, Piped-Test-Bus[1] 834 and Piped-Test-Bus0] 836 ("dcsuw2t in piped[6]" through "dcsuw2t in piped[0]"). (Note that Piped-Test-Bus[0] 836 is a piped version of TDI 806.) Gated-TCK 804 first stops for two TCK cycles, while SC-CLK, which does not stop at the Pause-DR state, stops for one clock cycle. SC1 812 and SC0 814 are sampled and double-sampled versions of SC2; the three signals {SC2, SC1, SC0} are valid at the falling edge of Gated-TCK 804. The Root-SIB samples {SC2, SC1, SC0}="100" and TDI="1" at a time-point 838. This combination is recognized as an Open-SIB key.

After time-point 838, Gated-TCK 804 and SC-CLK 808 stop for two more clock cycles. Select signal 820 turns on (SIB Open) or off (SIB Closed) if, at the falling edge of Gated-TCK 804, both Update-Enable 816 and Update-Data 818 are at logic high, at a time-point 840. As an Open-SIB Key is recognized at time-point 838, the Root-SIB will set Select Line 820 to logic 1 at time-point 840, opening the SIB.

Figure 8B:
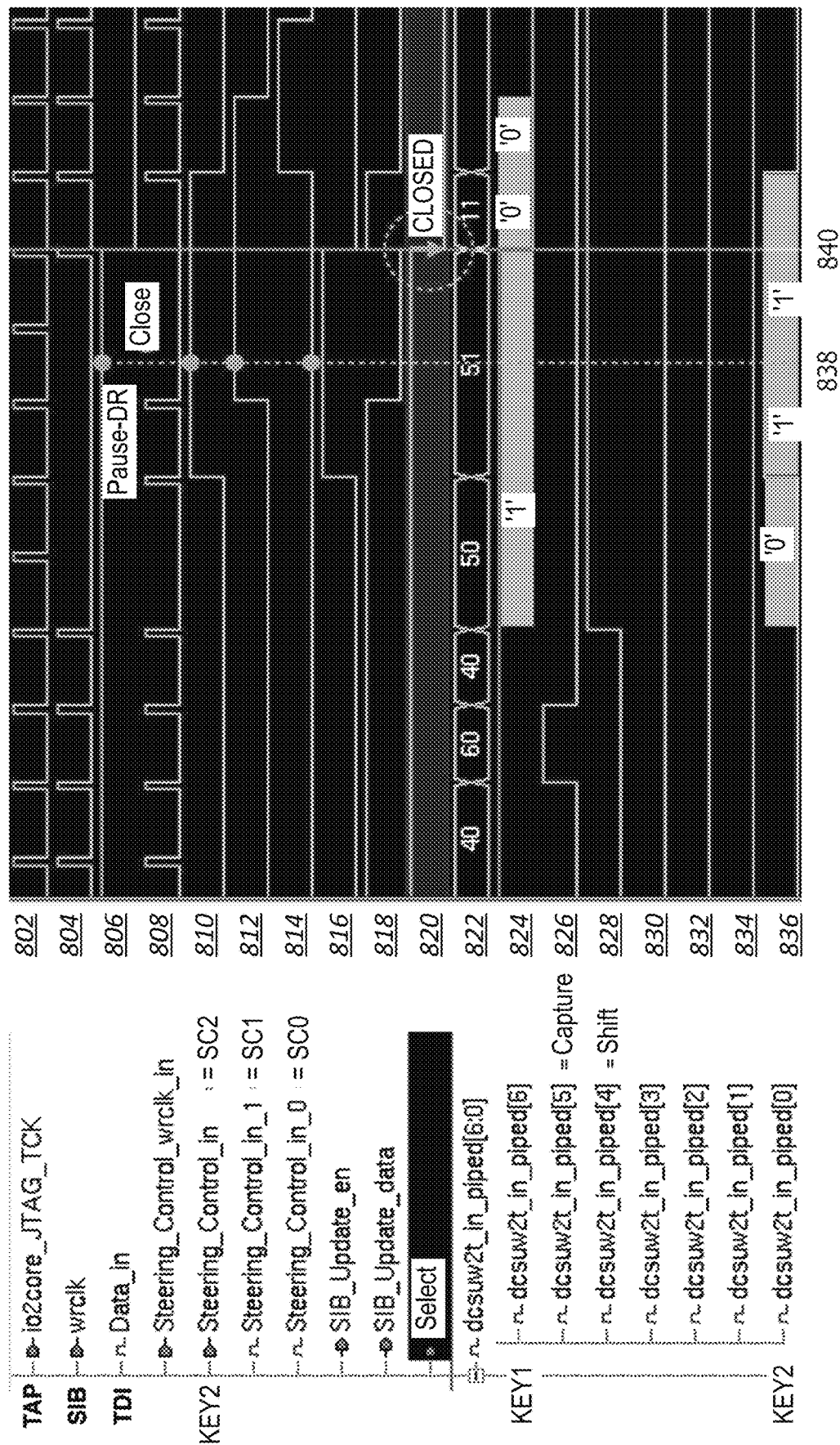
FIG. 8B is a timing diagram that schematically describes the timing waveforms of the key signals, in a Close-SIB command, in accordance with embodiments of the present invention.

FIG. 8B is a timing diagram that schematically describes the timing waveform of the key signals, in a Close-SIB command, in accordance with embodiments of the present invention.

The waveform of FIG. 8B is similar to the waveform of FIG. 8A, except that SC-CLK signal is active in the clock cycle preceding time-point 840 (caused by an additional Pause-DR state in the TAP-Control FSM). As a result, the Root-SIB samples a "111" at time-point 838, which is recognized as a Close-SIB instruction. Consequently, at time-pint 840, Select 820 turns low, closing the SIB. Thus, according to the example waveforms illustrated in FIGS. 8A, 8B, by issuing different patterns on the Steering Control and the TDI signals, and by gating the Gated-TCK and SC-CLK clocks, various key combinations or counter values may be generated, detected and decoded to instructions, including a Close-SIB instruction and an Open-SIB instruction.

As would be appreciated, the timing diagrams illustrated in FIGS. 8A, 8B and described hereinabove are cited by way of example. In alternative embodiments, other combinations of data and sampling clocks may be used, to encode open-SIB, close-SIB and/or other instructions.

Figure 9:
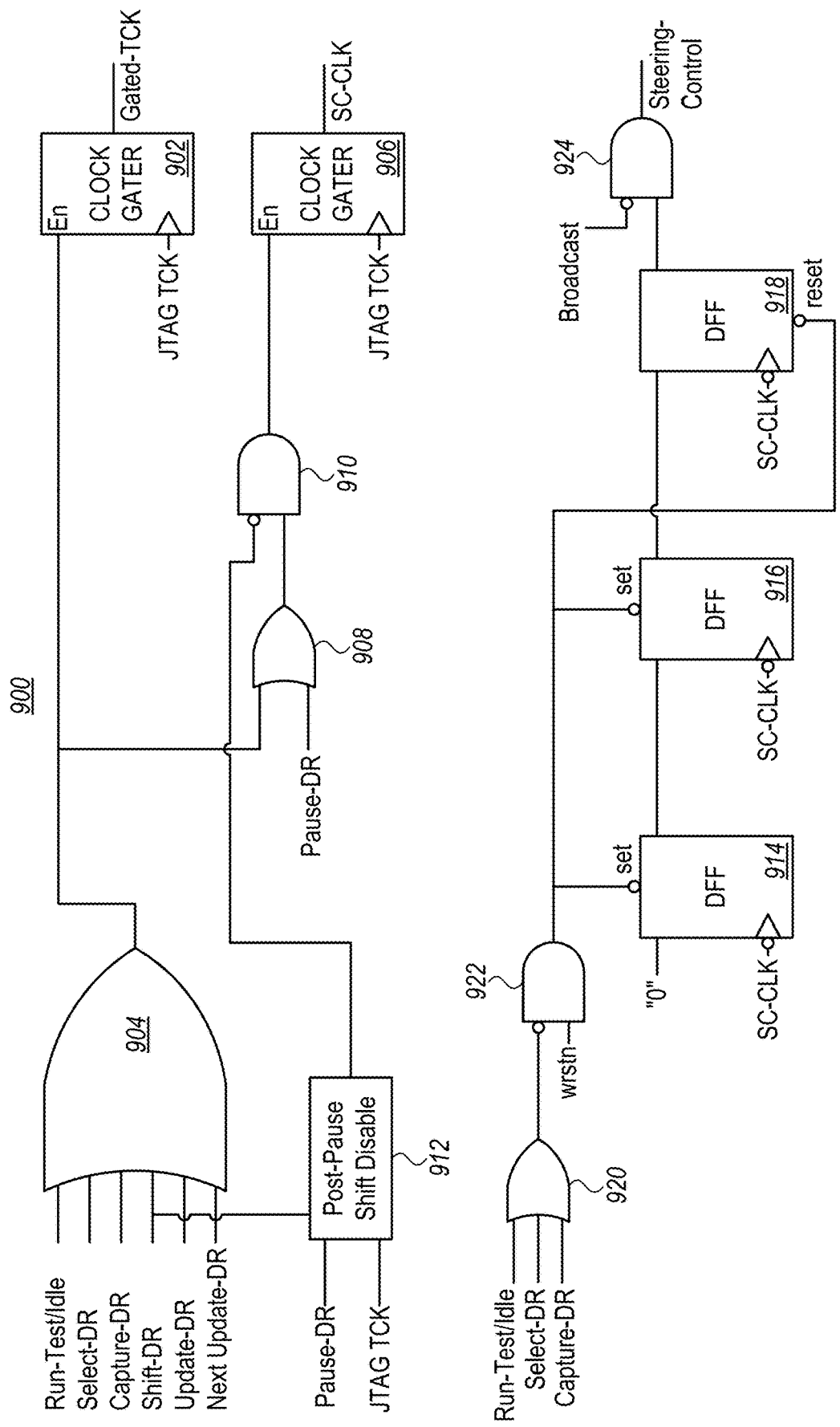
FIG. 9 is a circuit diagram that schematically describes a simplified logic structure of the TAP-Controller Steering Logic, in accordance with embodiments of the present invention.

FIG. 9 is a circuit diagram 900 that schematically describes a simplified logic structure of the TAP-Controller Steering Logic, in accordance with embodiments of the present invention. The steering control logic drives the Steering-Control Test-Bus signal (dcsuw2t[0]), and generates the Gated-CLK and the SC-CLK clocks of the Test-Bus.

A Clock-Gater 902 sends the JTAG-TCK input to the Gated-TCK output when the Clock-Gater's Enable input is at logic high. An Or gate 904 detects the TAP-Controller FSM states in which the clock should be enabled (Run-Test/Idle, Select-DR, Capture-DR, Shift-DR, Update-DR or Next-Update-DR (Next-Update-DR, which equals to the LAST Exit1-DR, and may be needed for efficient implementation of the steering logic).

A Clock-Gater 906 generates the SC-CLK gated clock, by enabling JTAG TCK. The enabling logic is similar to the enabling logic of Gated-TCK, except that an OR gate 808 enables Clock-Gater 906 also when the FSM is in the Pause-DR state, and except that an And gate 910 prevents the enabling of Clock-Gater 906 if a Post-Pause-Shift-Disable logic 912 is at logic-high (Post-Pause Shift Disable logic disables SC-CLK for one clock cycle following Pause; this is required in order to simplify the SIB's Re-Alignment Logic).

Steering Control signal (dcsuw2t[0]), is generated by a circuit comprising an Or gate 920, an And gate 922, a DFF 914, a DFF 916, a DFF 918 and an And gate 924. The three DFFs 914, 916 and 918 are configured as a three-bit shift register (DFF 918 is the least-significant bit). When reset is active (wrstn at logic-low), or, when the TAP-Controller FSM is at the Run-Test/Idle state, the Select-DR state or the Capture-DR state, the DFFs will be set to an initial state of binary 110. Thereafter, the steering logic will drive the Steering-Control signal with the sequence (from left to right) 011000 . . . , clocked at falling edges of SC-CLK.

Note that when a Broadcast instruction is set, an And gate 924 will force the steering control output to logic-low (broadcast handling will be described hereinbelow).

As would be appreciated, circuit diagram 900 illustrated in FIG. 9 and described hereinabove is cited by way of example. In alternative embodiments various suitable circuits may be used. In some embodiments, more than two keys and/or gated clocks may be generated, enabling more keys and more commands. The logic circuit illustrated in FIG. 9 may be implemented by a functionally equivalent logic circuit, for example, using a Programmable-Logic-Array (PLA). In some embodiments positive rather than negative, or positive and negative clock edges may clock the various DFFs.

Figure 10:
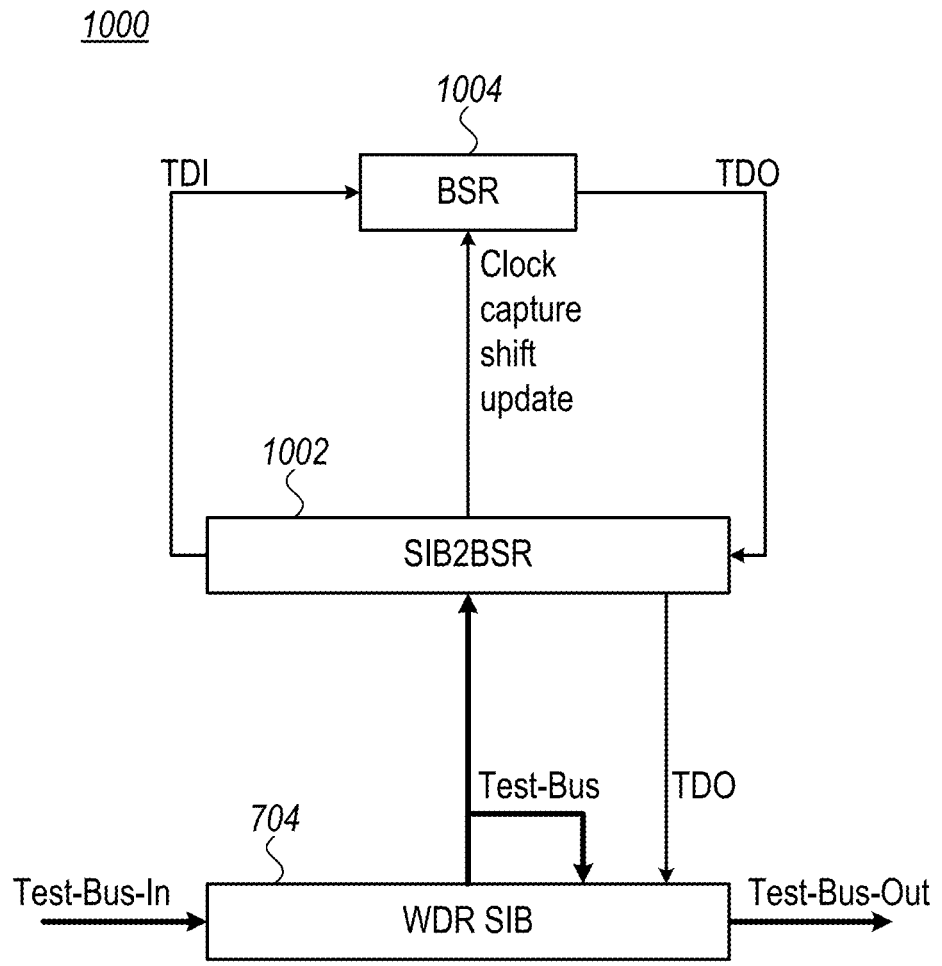
FIG. 10 is a block diagram that schematically describes a test-circuitry with interface to a JTAG1149.1 Boundary-Scan register, in accordance with embodiments of the present invention.

FIG. 10 is a block diagram that schematically describes a test-circuitry 100 (FIG. 1), with interface to a JTAG1149.1 Boundary-Scan register (BSR), in accordance with embodiments of the present invention.

The Test-Bus of the network is input to a WDR-SIB 704 (FIG. 7). When WDR-SIB 704 is Closed the Test-Buss propagates directly to the Test-Bus-Out. When WDR-SIB 704 is Open, the Test-Bus is forwarded to a SIB-to-BSR (SIB2BSR) 1002, which is coupled to a JTAG1149.1 BSR chain 1004.

SIB2BSR 1002 routes the Data signal of Test-Bus-In (dcsuw2t[6]) to BSR 1004 TDI input. SIB2BSR 1002 further re-times (sampling on the Falling edge of TCK) the TDO output of BSR 1004 and sends the retimed TDO back to WDR-SIB 704 TDI input.

SIB2BSR generates the clock, shift and update inputs of the BSR as follows:

The clock that the SIB2BSR sends to the BSR is a gated version of the Test-Bus TCK, which is enabled when the Test-Bus Shift or the Test-Bus Capture are set (dcsuw2t[5] & dcsuw2t[4]);

The Shift that the SIB2BSR sends to the BSR is the Shift signal of the Test-Bus (dcsuw2t[5]); and The Update that the SIB2BSR sends to the BSR is a single TCK pulse when the Test-Bus Update is valid (TCK & dcsuw2t[3]).

As would be appreciated, the testing frequency may be slowed when BSR chain is long and the clock propagate between the units. (In some embodiments, the clock may be routed as a clock tree to all the BSR cells, to increase the testing frequency. The control signals are routed to all BSR units.)

Thus, according to embodiments of the present invention, a testing network may interface with a JTAG 1149.1 boundary scan chain, using a simple SIB2BSR logic unit.

Broadcast Instruction

A Broadcast instruction may send the same data to multiple instruments. Hence, all WDR-SIBs and Root-SIBs are configured, upon detection of a Broadcast instruction, to route the bus to the WDR (for a WDR-SIB) or to lower hierarchies (Root-SIB). When a Broadcast command is programmed (in the IR), the TAP-Controller sends a Broadcast indication to the SIBs on a dedicated signal, which may have to be synchronized in the SIBs.

Configuration Status Inquiry

In some embodiment according to the present invention, an ATE can issue a Read-Configuration instruction, to read the configuration status of all SIBs, without changing the configuration.

The Read-Configuration instruction Opens all SIBs in the Network, and optionally disables the Update Enable signal, and/or other control signals. Only the Data bits of the Test-Bus are shifted out, to the TDO port.

In WDR-SIBs, The Read-Configuration instruction disables the control signals from reaching the WDR and bypasses the WDR to shift only the SIB Shift bit value.

The TAP-Controller is configured, upon executing a Read-Configuration instruction, to generate a Capture Enable pulse, after the Shift operation, instead of Update Enable, so that SIB Shift will be equal to SIB Update, as it was before the shift (thus, recirculating of the data from TDO back to TDI, in order to set the SIBs back to the original state, is not needed).

In an example embodiment, the data part of Test-Bus (dcsuw2t) that TAP Controller generates comprises (RCI is short for Read Configuration Inquiry):

dcsuw2t[6]=TDI;
dcsuw2t[5]=capture|(update & RCI);
dcsuw2t[4]=shift;
dcsuw2t[3]=update & ~RCI;
dcsuw2t[2]=SelectWIR;
dcsuw2t[1]=SelectWIR2;
dcsuw2t[0]=Steering_Control_data}.

In another embodiment, a dedicated signal indicates to the SIB that a Read-Configuration instruction is executed. In some embodiments, The Read-Configuration instruction is an additional Test-Bus signal that propagates through the SIBs, and in yet another embodiment an unused combination of Test-Bus signals indicates the Read-Configuration instruction (e.g., SelectWIR & SelectWIR2).

Critical Cores Access Redundancy

In embodiments according to the present invention, the integrated circuit may comprise one or more critical cores that must be accessible through the testing network. For example, a security core that must authenticate a user, to allow further accesses to cores of the integrated circuit.

In some embodiments, redundant access paths to one or more critical cores are provided. In an embodiment, a unidirectional Bridge-SIB connects the redundant path to the hierarchy containing the critical core; the unidirectional Bridge-SIB is like a Root-SIB with additional MUX to connect the two hierarchies as one, except that it asserts a Bypass output when open. The Bypass output is coupled to a Bypass circuit that can bypass the Root-SIB of the hierarchy in which the critical Core is located.

In other embodiments a bidirectional Bridge-SIB, comprising two back-to-back unidirectional Bridge-SIBs may be used, with two respective Bypass circuits. The bidirectional Bridge-SIB may be programmed so that one of the unidirectional SIBs is active and the other is not.

In some embodiments, a unidirectional or a bidirectional Bridge-SIB may be programmed via the Test-Bus, "on the fly". In other embodiments, the bridge is programmed by other means; e.g., by a dedicated control line.

Unidirectional and Bidirectional Bridge-SIBs are collectively referred to herein as Bridge-SIBs.

Thus, according to embodiments of the present invention that were disclosed herein, a test circuitry of an integrated circuit, which comprises daisy chain connections between SIBs, provides fast testing compliant to IEEE 1687, by means of both faster test clock frequency and a lower number of clock cycles. Accesses to sensitive cores is protected, and a variety of commands can be implemented.

The configurations and methods described hereinabove, including Network 100, Testing-Bus 104, TAP-Controller 102, retiming circuitry 300, Root-SIB 108 and portions thereof, which were described hereinabove are example configurations that are depicted purely for the sake of conceptual clarity. In alternative embodiments, any other suitable network, buses and logic units can be used. Some elements that are not mandatory for understanding of the disclosed techniques have been omitted from the figures for the sake of clarity.

The different testing circuitry elements described hereinabove may be implemented using suitable hardware, such as in one or more Application-Specific Integrated Circuit (ASIC) or Field-Programmable Gate Arrays (FPGA), using hardware, using software, or using a combination of hardware and software elements.

Although the embodiments described herein mainly address JTAG systems, the methods and systems described herein can also be used in other applications, such as real-time measurement and real time monitoring (for example, Multiple modules that monitor voltage, temperature operating conditions and process degradation may be placed in the device and be controlled by a SIB network, during functional operation).

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. An Integrated Circuit (IC), comprising:
multiple hardware units; and
testing circuitry, comprising:
a Test Access Port (TAP) controller, which is coupled to a test port of the IC;
multiple Segment-Insertion-Bit circuits (SIBs) arranged in two or more hierarchy levels, wherein some of the SIBs are connected to the hardware units, and some of the SIBs are root-SIBs that connect between neighbor hierarchy levels; and
a test bus, which runs in a daisy-chained loop path starting at the TAP controller, passing via at least some of the SIBs and ending back at the TAP controller,
wherein each root-SIB has an Open state in which the root-SIB routes the test bus between the neighbor hierarchy levels, and a Closed state in which the root-SIB disconnects the test bus between the neighbor hierarchy levels, and
wherein the TAP controller is configured to:
for a selected subset of the hardware units that are to be tested, select one or more root-SIBs that, when set to the Open state, make the selected subset of hardware units reachable by the test bus; and
send via the daisy-chained test bus a data stream comprising one or more instructions that set two or more of the selected root-SIBs to the Open state.

2. The IC according to claim 1, wherein the TAP controller is configured to send in the data stream a single instruction that sets the two or more of the selected root-SIBs to the Open state.

3. The IC according to claim 1, wherein each of the selected root-SIBs is configured to receive the data stream over the test bus, to transition to the Open state responsively to the one or more instructions, and to forward the data stream downstream over the test bus to a next hierarchy level.

4. The IC according to claim 1, wherein the TAP controller is configured to further send in the data stream, together with the one or more instructions that set the root-SIBs to the Open state, data values for testing one or more of the hardware units.

5. The IC according to claim 1, wherein the TAP controller is configured to send the data stream by sending at least first and second bit streams over respective first and second lines of the test bus that are clocked by respective first and second clock signals.

6. The IC according to claim 5, wherein the TAP controller is configured to send an instruction to a target SIB by sending first and second bit patterns on the first and second lines, respectively, and gating one or both of the first and second clock signals responsively to the instruction and to a distance of the target SIB from the TAP controller.

7. The IC according to claim 1, wherein the TAP controller is configured to send in the data stream a compound-command that comprises a concatenation of at least two instructions for execution by different SIBs.

8. The IC according to claim 1, wherein the TAP controller is configured to send in the data stream an Inquire Configuration command that sets all the root-SIBs to the Open state while bypassing the hardware units and allows flow of data through all the SIBs.

9. The IC according to claim 1, wherein a given hardware unit is reachable via two or more different paths of the test bus, and wherein at least one of the SIBs is a Bridge SIB that is configured to select and enable only a single path from among the two or more different paths to the given hardware unit.

10. A method for testing, comprising:
receiving a test request via a test port in an Integrated Circuit (IC) that comprises:
multiple hardware units; and
testing circuitry, comprising:
a Test Access Port (TAP) controller, which is coupled to the test port;
multiple Segment-Insertion-Bit circuits (SIBs) arranged in two or more hierarchy levels, wherein some of the SIBs are connected to the hardware units, and some of the SIBs are root-SIBs that connect between neighbor hierarchy levels; and
a test bus, which runs in a daisy-chained loop path starting at the TAP controller, passing via at least some of the SIBs and ending back at the TAP controller,
wherein each root-SIB has an Open state in which the root-SIB routes the test bus between the neighbor hierarchy levels, and a Closed state in which the root-SIB disconnects the test bus between the neighbor hierarchy levels;
responsively to the test request, for a selected subset of the hardware units that are to be tested, selecting by the TAP controller one or more root-SIBs that, when set to the Open state, make the selected subset of hardware units reachable by the test bus; and
sending from the TAP controller, via the daisy-chained test bus, a data stream comprising one or more instructions that set two or more of the selected root-SIBs to the Open state.

11. The method according to claim 10, wherein sending the data stream comprises sending in the data stream a single instruction that sets the two or more of the selected root-SIBs to the Open state.

12. The method according to claim 10, and comprising, in each of the selected root-SIBs, receiving the data stream over the test bus, transitioning to the Open state responsively to the one or more instructions, and forwarding the data stream downstream over the test bus to a next hierarchy level.

13. The method according to claim 10, wherein sending the data stream comprises further sending in the data stream, together with the one or more instructions that set the root-SIBs to the Open state, data values for testing one or more of the hardware units.

14. The method according to claim 10, wherein sending the data stream comprises sending at least first and second bit streams over respective first and second lines of the test bus that are clocked by respective first and second clock signals.

15. The method according to claim 14, wherein sending the data stream comprises sending an instruction to a target SIB by sending first and second bit patterns on the first and second lines, respectively, and gating one or both of the first and second clock signals responsively to the instruction and to a distance of the target SIB from the TAP controller.

16. The method according to claim 10, wherein sending the data stream comprises sending in the data stream a compound-command that comprises a concatenation of at least two instructions for execution by different SIBs.

17. The method according to claim 10, wherein sending the data stream comprises sending in the data stream an Inquire Configuration command that sets all the root-SIBs to the Open state while bypassing the hardware units and allows flow of data through all the SIBs.

18. The method according to claim 10, wherein a given hardware unit is reachable via two or more different paths of the test bus, and wherein at least one of the SIBs is a Bridge SIB that is configured to select and enable only a single path from among the two or more different paths to the given hardware unit.

* * * * *